United States Patent [19]

Lee et al.

[11] Patent Number: 5,431,770
[45] Date of Patent: Jul. 11, 1995

[54] TRANSISTOR GATE FORMATION

[75] Inventors: Kuo-Hua Lee, Wescosville; Chen-Hua D. Yu, Allentown, both of Pa.

[73] Assignee: AT&T Corp., Murray Hill, N.J.

[21] Appl. No.: 136,516

[22] Filed: Oct. 13, 1993

[51] Int. Cl.⁶ .............................................. H01L 21/00
[52] U.S. Cl. .................................. 156/653.1; 437/228
[58] Field of Search ............ 156/653, 657, 656, 659.1, 156/661.1; 437/228

[56] References Cited

U.S. PATENT DOCUMENTS

| | | |
|---|---|---|
| 4,460,435 | 7/1984 | Maa .................... 156/657 X |
| 5,139,904 | 8/1992 | Auda et al. ............ 156/659.1 X |
| 5,169,487 | 12/1992 | Langley et al. ........ 156/657 X |

Primary Examiner—Thi Dang
Attorney, Agent, or Firm—John T. Rehberg

[57] ABSTRACT

A method for forming transistors having sublithographic features, for example, gates, is disclosed. A patterned hardmask (formed, for example from PETEOS) is created overlying oxide and polysilicon layers. The dimensions of the hardmask are reduced by isotropic etching. The reduced-dimension hardmask is used with an anisotropic etching process to define a reduced-dimension feature such as a gate.

7 Claims, 1 Drawing Sheet

TRANSISTOR GATE FORMATION

TECHNICAL FIELD

This invention relates to methods of semiconductor integrated circuit formation.

BACKGROUND OF THE INVENTION

As the use of integrated circuits becomes more pervasive, the geometries of individual circuits continue to shrink. Generally speaking, the lithographic process, which involves patterning a photoresist material and subsequently anisotropically etching underlying layers, determines the size of the smallest features which can be created in an integrated circuit. However, designers have continually sought techniques which will produce features or openings which have dimensions that are less than what may be achieved by conventional lithography.

One of the most fundamental features of a MOSFET (metal oxide semiconductor field effect transistor) is the gate. Generally speaking, circuits with smaller gates operate more quickly, and contain more transistors.

SUMMARY OF THE INVENTION

The present invention addresses the above-mentioned concerns. In an illustrative embodiment, the invention includes: forming a first material layer upon a substrate; forming a second material layer overlying the first material layer, and then patterning the second material layer, thereby forming a raised topographic feature overlying the substrate. The topographic feature is then isotropically etched. Then, using the isotropically etched topographic feature as a mask, the first layer is anisotropically etched.

DETAILED DESCRIPTION

Figure 1:
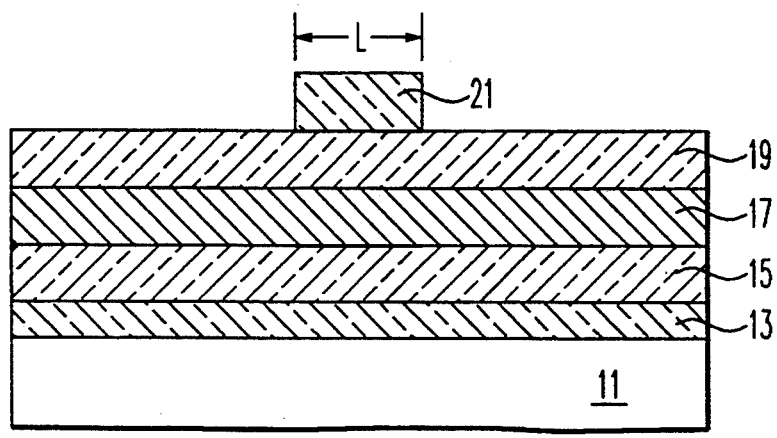
FIGS. 1-4 are cross-sectional views of an illustrative embodiment of the present invention.

In FIG. 1 reference numeral 11 denotes a substrate which may illustratively be silicon, doped silicon, epitaxial silicon, a layer of epitaxial silicon upon doped silicon, etc. In general, the term substrate refers to a material or body upon which a variety of layers may be formed. Reference numeral 13 denotes a dielectric layer, typically silicon dioxide or, possibly, silicon oxynitride. Typically, layer 13 is formed upon substrate 11 (after the field oxide has been formed) by thermal oxidation. The thickness of layer 13 may be typically between 50Å and 500Å.

Layer 15 is a conductive material, typically polysilicon (which may or may not be doped at this juncture). The thickness of layer 15, if it is polysilicon, is typically between 500Å and 5000Å. Layer 15 may be typically formed by chemical vapor deposition.

Layer 17 is an optional layer which may be a refractory metal silicide, typically tungsten silicide. The thickness of layer 17 is between 500Å and 5000Å. Layer 17 may be formed by a variety of means including sputtering or chemical vapor deposition.

Layer 19 is desirably any material capable of being used as a hardmask in a hardmask etching process. Typically, layer 19 may be formed from plasma-enhanced TEOS. If layers 13, 15 and 17 have thicknesses within the ranges mentioned previously, the thickness of layer 19 is desirably between 1000Å and 3000Å.

Feature 21 is a patterned photoresist. The length L of feature 21 may be assumed to be the smallest dimension achievable by lithography.

Figure 2:
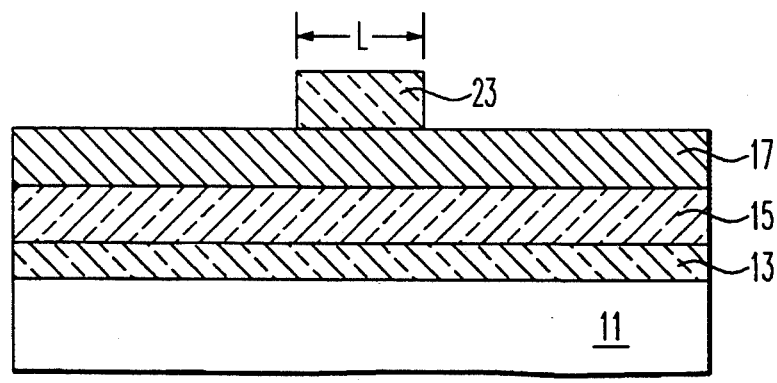

Turning to FIG. 2, patterned photoresist has been utilized in connection with an anisotropic etching process, typically involving $CF_4$ and $O_2$ to form raised feature 23 from layer 19. Photoresist 21 may then be removed.

Figure 3:
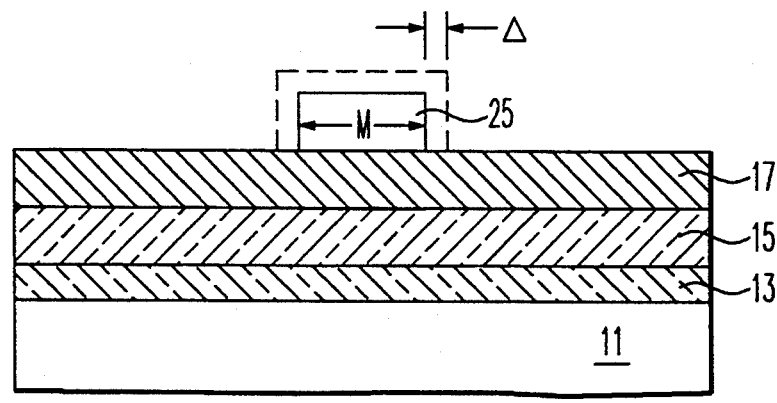

In FIG. 3, raised feature 23 is subjected to an isotropic process producing a smaller raised feature 25. For example, if raised feature 25 is PETEOS, having a length, L, equal to 0.5 $\mu$m and a height equal to 0.25 $\mu$m (i.e., the thickness of layer 19), it may be subjected to a wet etching process using 100:1 HF for a period of time between 2 minutes and 5 minutes. The wet etching process is isotropic and may be expected to shrink the height of feature 21 by an amount between 0.02 $\mu$m and 0.05 $\mu$m because both the left and right sides of feature 21 are attacked by the isotropic process. Consequently, the length L of feature 25 is reduced by approximately twice the amount that the height of feature 21 is reduced. Mathematically, $L = M + 2\Delta$ where $\Delta$ equals the quantity of isotropic material removal.

Feature 25, which has been reduced by the isotropic etching process to a length substantially smaller than what is achievable lithographically, may now be used as a hardmask for the subsequent anisotropic etching of layers 17, 15 and 13. It is important to keep in mind, when choosing the initial thickness of layer 19 in FIG. 1, that hardmask feature 25 must still have sufficient height after the isotropic etching of FIG. 3, to withstand the rigors of the subsequent anisotropic etching process which will attack layers 17, 15 and 13.

Figure 4:
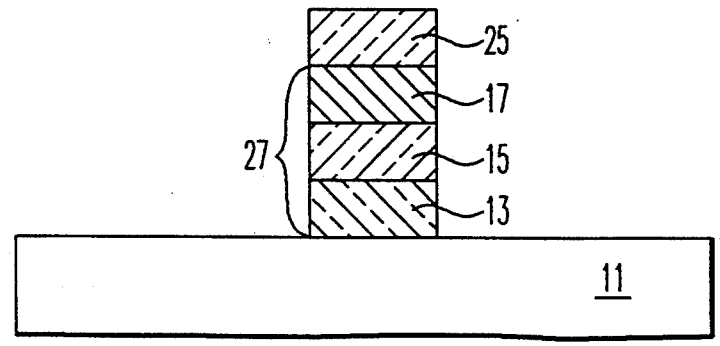

Turning to FIG. 4, feature 25, having length M substantially smaller than what is lithographically achievable, is utilized as a hardmask in the anisotropic etching of layers 17, 15 and 13. Typically, the anisotropic etching may be performed by $HB_1$ and $CL_2$. Layers 17, 15 and 13 ultimately comprise gate stack 27. Subsequent semiconductor integrated circuit processing may commence at this point, including definition of source and drain regions by, for example, ion implantation, deposition of a dielectric layer, contact window opening to source/drain, etc.

We claim:

1. A method of integrated circuit fabrication comprising:
    forming a first material layer upon a substrate;
    forming a second material layer overlying said first material layer;
    forming a patterned resist over said second material layer;
    patterning said second material layer using said patterned resist as a mask, thereby forming a raised topographic feature overlying said substrate;
    removing said resist;
    isotropically etching said raised topographic feature;
    using said isotropically etched topographic feature as a mask, anisotropically etching said first layer.

2. The method of claim 1 in which said substrate is silicon.

3. The method of claim 1 in which said first material layer comprises silicon dioxide.

4. The method of claim 3 in which said first material layer comprises silicon dioxide and polysilicon.

5. The method of claim 4 in which said first material layer comprises silicon dioxide and polysilicon and a refractory metal silicide.

6. The method of claim 1 in which said second material layer is formed from TEOS.

7. A method of forming an integrated circuit having at least one transistor with a gate comprising:
- forming a layer of thermal silicon dioxide upon a silicon substrate;
- forming a layer of polysilicon upon said layer of thermal oxide;
- forming a layer of tungsten silicide upon said layer of polysilicon;
- forming a layer of dielectric from TEOS upon said layer of dielectric; tungsten silicide;
- forming a patterned resist over said layer of dielectric;
- patterning said dielectric using said patterned resist as a mask to form a raised topographic feature having at least one dimension;
- isotropically etching said patterned dielectric, thereby reducing said dimension;
- using said isotropically etched patterned dielectric as a mask, anisotropically etching at least said tungsten silicide layer, and said polysilicon layer to form a gate.

* * * * *